United States Patent
Kim et al.

(10) Patent No.: US 11,444,131 B2
(45) Date of Patent: Sep. 13, 2022

(54) DISPLAY APPARATUS

(71) Applicant: SAMSUNG DISPLAY CO., LTD., Yongin-si (KR)

(72) Inventors: Mina Kim, Suwon-si (KR); Kwang-Chul Jung, Seoul (KR); Wonkyu Kwak, Seongnam-si (KR); Dongsoo Kim, Hwaseong-si (KR); Jinkoo Chung, Suwon-si (KR); Yongjun Jo, Hwaseong-si (KR); Changsoo Pyon, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 160 days.

(21) Appl. No.: 16/931,784

(22) Filed: Jul. 17, 2020

(65) Prior Publication Data
US 2021/0043697 A1 Feb. 11, 2021

(30) Foreign Application Priority Data
Aug. 5, 2019 (KR) .................. 10-2019-0095214

(51) Int. Cl.
*H01L 27/32* (2006.01)
*H01L 51/52* (2006.01)

(52) U.S. Cl.
CPC ...... *H01L 27/3218* (2013.01); *H01L 27/3213* (2013.01); *H01L 27/3216* (2013.01);
(Continued)

(58) Field of Classification Search
CPC ............ H01L 51/525; H01L 51/5281; H01L 27/3216; H01L 27/3211–3218; H01L 27/3246; H01L 51/5209
See application file for complete search history.

(56) References Cited

U.S. PATENT DOCUMENTS 10,854,687 B2 * 12/2020 Joo .................. H01L 51/56
2014/0252321 A1 * 9/2014 Pyon ............... H01L 27/3246
257/89
(Continued)

FOREIGN PATENT DOCUMENTS

CN 108054184 A * 5/2018 ......... H01L 27/3216
CN 108122950 A * 6/2018 ......... H01L 27/3211
(Continued)

OTHER PUBLICATIONS

Machine translation, Chery, WIPO Pat. Pub. No. WO-2013098534-A1, translation date: Feb. 19, 2022, Clarivate Analytics, all pages (Year: 2022).*
(Continued)

*Primary Examiner* — Victoria K. Hall
(74) *Attorney, Agent, or Firm* — F. Chau & Associates, LLC

(57) ABSTRACT

A display apparatus includes a display area extending in a first direction and a second direction, first to fourth sub-pixels, and a spacer. The first sub-pixel emits a first color light, and includes first and second sides extending in a third direction inclined at a predetermined angle with the first direction, and third and fourth sides extending in a fourth direction perpendicular to the third direction. The second sub-pixel emits a second color light, and is disposed adjacent to the second side of the first sub-pixel in the fourth direction. The third sub-pixel emits a third color light, and is disposed adjacent to the fourth side of the first sub-pixel in the third direction. The fourth sub-pixel emits the first color light, and is disposed adjacent to the second and third sub-pixels. The spacer is disposed between the first and second sub-pixels and between the third and fourth sub-pixels.

20 Claims, 10 Drawing Sheets

(52) U.S. Cl.
CPC ........ *H01L 27/3246* (2013.01); *H01L 51/525* (2013.01); *H01L 51/5209* (2013.01); *H01L 51/5281* (2013.01)

(56) References Cited

U.S. PATENT DOCUMENTS

| | | | | |
|---|---|---|---|---|
| 2015/0123150 | A1* | 5/2015 | Adachi | H01L 27/3246 257/88 |
| 2015/0162391 | A1* | 6/2015 | Kim | H01L 51/525 257/40 |
| 2016/0225833 | A1* | 8/2016 | Kim | H01L 27/3218 |
| 2016/0225834 | A1* | 8/2016 | Kim | H01L 27/3218 |
| 2016/0322433 | A1 | 11/2016 | Kim et al. | |
| 2016/0351116 | A1* | 12/2016 | Sun | H01L 27/3216 |
| 2017/0205954 | A1* | 7/2017 | Kwon | G06F 3/0448 |
| 2019/0074329 | A1* | 3/2019 | Kim | H01L 51/525 |
| 2020/0013985 | A1* | 1/2020 | Park | H01L 27/3258 |
| 2020/0119237 | A1* | 4/2020 | Kim | H01L 25/0753 |
| 2020/0235172 | A1* | 7/2020 | Lee | G06F 3/0443 |
| 2020/0273924 | A1* | 8/2020 | Xiao | H01L 51/0011 |
| 2020/0286963 | A1* | 9/2020 | Lee | C23C 14/042 |
| 2020/0335717 | A1* | 10/2020 | Kim | G09F 9/301 |
| 2021/0066642 | A1* | 3/2021 | Lee | H01L 51/525 |
| 2021/0091151 | A1* | 3/2021 | Lee | H01L 27/3216 |
| 2021/0175295 | A1* | 6/2021 | Lee | H01L 51/5237 |
| 2021/0183961 | A1* | 6/2021 | Kim | H01L 27/3218 |
| 2021/0200386 | A1* | 7/2021 | Park | H01L 27/3216 |
| 2021/0225953 | A1* | 7/2021 | Luo | C23C 14/24 |
| 2021/0225970 | A1* | 7/2021 | Ryu | H01L 27/326 |

FOREIGN PATENT DOCUMENTS

| | | | | |
|---|---|---|---|---|
| CN | 111048552 A | * | 4/2020 | ....... G02F 1/133512 |
| EP | 3 451 383 | | 3/2019 | |
| EP | 3637471 A1 | * | 4/2020 | ....... G02F 1/133512 |
| KR | 10-2014-0111505 | | 9/2014 | |
| KR | 10-2015-0067624 | | 6/2015 | |
| KR | 10-2016-0065397 | | 6/2016 | |
| KR | 10-1878087 | | 7/2018 | |
| WO | WO-2013098534 A1 | * | 7/2013 | ......... H01L 51/5203 |
| WO | WO-2019044114 A1 | * | 3/2019 | ........... G02F 1/1343 |
| WO | WO-2019073680 A1 | * | 4/2019 | ............... G09F 9/30 |

OTHER PUBLICATIONS

Machine translation, Dai, Chinese Pat. Pub. No. CN-108054184-A, translation date: Feb. 19, 2022, Clarivate Analytics, all pages (Year: 2022).*

Machine translation, Kim, Chinese Pat. Pub. No. CN-111048552-A, translation date: Feb. 19, 2022, Clarivate Analytics, all pages (Year: 2022).*

Machine translation, Kajiyama, WIPO Pat. Pub. No. WO-2019073680-A1, translation date: Feb. 19, 2022, Clarivate Analytics, all pages (Year: 2022).*

Machine translation, Kim, Chinese Pat. Pub. No. CN-108122950-A, translation date: Feb. 19, 2022, Clarivate Analytics, all pages (Year: 2022).*

Machine translation, Kurata, WIPO Pat. Pub. No. WO-2019044114-A1, translation date: Feb. 19, 2022, Clarivate Analytics, all pages (Year: 2022).*

Extended European Search Report dated Mar. 12, 2021 From the European Patent Office in Corresponding European Patent Application No. 20182989.2.

Extended European Search Report dated Oct. 4, 2021 From the European Patent Office in Corresponding European Patent Application No. 21182806.6.

* cited by examiner

DISPLAY APPARATUS

CROSS-REFERENCE TO RELATED APPLICATIONS

This application claims priority under 35 U.S.C. § 119 to Korean Patent Application No. 10-2019-0095214, filed on Aug. 5, 2019, the disclosure of which is incorporated by reference herein in its entirety.

TECHNICAL FIELD

Exemplary embodiments of the inventive concept relate to a display apparatus, and more particularly, to a display apparatus for a vehicle capable of reducing external light reflection and improving aperture ratio.

DISCUSSION OF THE RELATED ART

Light weight, small and portable display apparatuses are becoming more widely used. Cathode ray tube (CRT) display apparatuses have been used in the past due to their performance and competitive price. However, CRT display apparatuses have a large size low portability. Accordingly, display apparatuses such as a plasma display apparatus, a liquid crystal display apparatus and an organic light emitting display apparatus have become more widely used due to their small size, light weight and low power consumption.

A display apparatus may be implemented in a vehicle. When a display apparatus is implemented in a vehicle, the environment in the vehicle may influence the display apparatus. For example, external light reflection may cause visibility problems when the display apparatus is being viewed by a user.

SUMMARY

Exemplary embodiments of the inventive concept provide a display apparatus for a vehicle capable of reducing external light reflection and improving aperture ratio for display quality.

According to an exemplary embodiment of the inventive concept, a display apparatus includes a display area extending in a first direction and a second direction, in which the first direction is a horizontal direction, and the second direction is perpendicular to the first direction. The display apparatus further includes first to fourth sub-pixels. The first sub-pixel emits a first color light, and includes first and second sides extending in a third direction which is inclined at a predetermined angle with the first direction, and third and fourth sides extending in a fourth direction perpendicular to the third direction. The second sub-pixel emits a second color light, and is disposed adjacent to the second side of the first sub-pixel in the fourth direction. The third sub-pixel emits a third color light, and is disposed adjacent to the fourth side of the first sub-pixel in the third direction. The fourth sub-pixel emits the first color light, and is disposed adjacent to the second and third sub-pixels. The display apparatus further includes a spacer, which maintains a cell gap, and is disposed between the first sub-pixel and the second sub-pixel and between the third sub-pixel and the fourth sub-pixel, and extending in the third direction. The first to fourth sub-pixels are disposed in the display area, and each of the first to fourth sub-pixels corresponds to a light emitting area.

In an exemplary embodiment, the first direction and the third direction form an angle of about 45 degrees, and the first sub-pixel has a rhombus shape.

In an exemplary embodiment, the second sub-pixel and the third sub-pixel each have a quadrangular shape having sides extending along the third direction and the fourth direction.

In an exemplary embodiment, a size of the first sub-pixel is larger than a size of at least one of the second sub-pixel or the third sub-pixel.

In an exemplary embodiment, the first color light is blue light, the second color light is green light, and the third color light is red light.

In an exemplary embodiment, a long side of a first green sub-pixel or a first red sub-pixel is adjacent to the first side of the first sub-pixel, and a short side of a second green sub-pixel and a short side of a second red sub-pixel are adjacent to the second side of the first sub-pixel.

In an exemplary embodiment, a separation distance between the first sub-pixel and the second sub-pixel is greater than a separation distance between the first sub-pixel and a closest neighboring sub-pixel adjacent to the first side of the first sub-pixel.

In an exemplary embodiment, the display apparatus further includes a fifth sub-pixel, which emits the third color light, disposed adjacent to the second side of the first sub-pixel in the fourth direction. The fifth sub-pixel and the second sub-pixel are spaced apart from each other in the third direction, and a separation distance between the first sub-pixel and the second sub-pixel is greater than a separation distance between the first sub-pixel and the fifth sub-pixel.

In an exemplary embodiment, the display apparatus further includes a thin film transistor substrate including a plurality of thin film transistors, a plurality of pixel electrodes disposed on the thin film transistor substrate, a pixel defining layer disposed on the thin film transistor substrate and having an opening exposing the pixel electrodes, and a sealing substrate facing the thin film transistor substrate. The spacer is formed by a protruding portion of the pixel defining layer.

In an exemplary embodiment, a protruding opening may be formed in an outward direction of the opening at a corner of the opening of the pixel defining layer in the first direction.

According to an exemplary embodiment of the inventive concept, a display apparatus includes a thin film transistor substrate extending in a first direction, which is a horizontal direction, and a second direction perpendicular to the first direction, a pixel electrode disposed on the thin film transistor substrate, and a pixel defining layer disposed on the thin film transistor substrate and having an opening exposing a portion of the pixel electrode. The opening of the pixel defining layer includes sides extending along a third direction inclined at a predetermined angle with the first direction, and sides extending along a fourth direction perpendicular to the third direction. A protruding opening is formed in an outward direction of the opening at a corner of the opening of the pixel defining layer in the first direction.

In an exemplary embodiment, a protrusion is formed at a corner of the pixel electrode in the first direction in a location corresponding to the protruding opening of the opening of the pixel defining layer.

In an exemplary embodiment, the protruding opening of the opening of the pixel defining layer has a curved shape.

In an exemplary embodiment, a vertex of the protruding opening of the opening of the pixel defining layer has an angle of less than about 90 degrees.

In an exemplary embodiment, the pixel electrode has a rectangular shape or a square shape.

In an exemplary embodiment, the display apparatus further includes a light emitting layer disposed on the pixel electrode, and an opposite electrode disposed on the light emitting layer.

In an exemplary embodiment, the opening of the pixel defining layer defines a plurality of sub-pixels, each of which is a light emitting area, and the plurality of sub-pixels includes first to fourth sub-pixels. The first sub-pixel emits a first color light, and includes first and second sides extending in the third direction, and third and fourth sides extending in the fourth direction. The second sub-pixel emits a second color light, and is disposed adjacent to the second side of the first sub-pixel in the fourth direction. The third sub-pixel emits a third color light, and is disposed adjacent to the fourth side of the first sub-pixel in the third direction. The fourth sub-pixel emits the first color light, and is disposed adjacent to the second and third sub-pixels.

In an exemplary embodiment, the display apparatus further includes a sealing substrate facing the thin film transistor substrate, and a spacer, which maintains a cell gap, and is disposed between the thin film transistor substrate and the sealing substrate, between the first sub-pixel and the second sub-pixel, and between the third sub-pixel and the fourth sub-pixel, and extending in the third direction.

In an exemplary embodiment, a size of the first sub-pixel is larger than a size of at least one of the second sub-pixel or the third sub-pixel.

In an exemplary embodiment, the first direction and the third direction form an angle of about 45 degrees, and the opening of the pixel defining layer has a rhombus shape or an inclined rectangular shape with respect to the first direction and the second direction.

According to exemplary embodiments of the present inventive concept, a display apparatus includes a plurality of sub-pixels disposed in a display area which extends in a first direction, which is a horizontal direction, and in a second direction perpendicular to the first direction. Each of the sub-pixels corresponds to a light emitting area. The display apparatus includes a first sub-pixel emitting a first color light, and including first and second sides extending in a third direction which is inclined at a predetermined angle with the first direction, and third and fourth sides extending in a fourth direction perpendicular to the third direction. The display apparatus further includes a second sub-pixel emitting a second color light and disposed adjacent to the second side of the first sub-pixel in the fourth direction, a third sub-pixel emitting a third color light and disposed adjacent to the fourth side of the first sub-pixel in the third direction, and a fourth sub-pixel emitting the first color light and disposed adjacent to the second and third sub-pixels. The display apparatus further includes a spacer for maintaining a cell gap, disposed between the first sub-pixel and the second sub-pixel, and between the third sub-pixel and the fourth sub-pixel, and extending in the third direction. Protrusions may be formed at corners of the sub-pixels in the first direction.

The display apparatus includes sub-pixels and spacers that are appropriately arranged, thereby implementing a high aperture ratio structure. Since protrusions are formed at corners of the sub-pixels to reduce reflection of external light, a display apparatus suitable for a vehicle display device can be provided.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
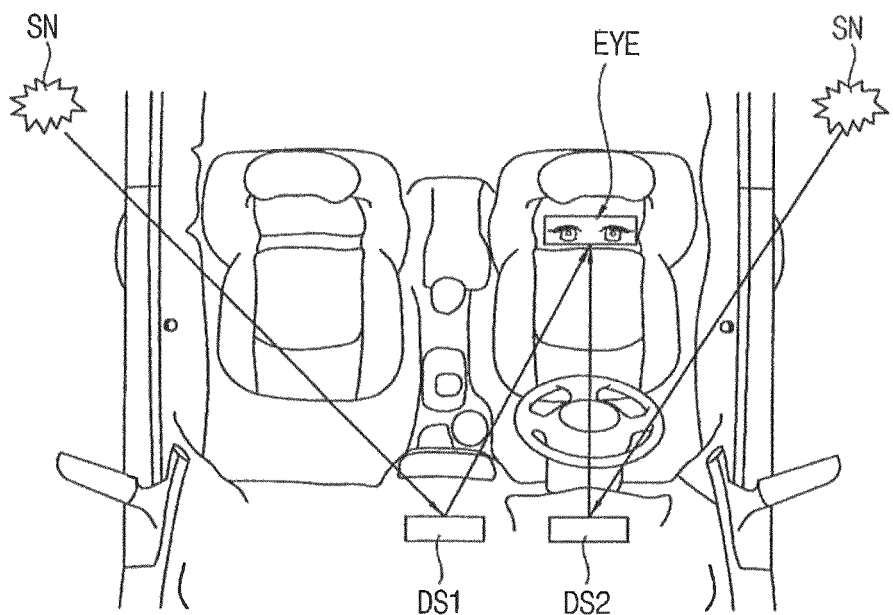
FIG. 1 is a view for explaining a reflection of external light when a display apparatus according to an exemplary embodiment of the inventive concept is used in a vehicle.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Herein, when an element such as, for example, a sub-pixel, is described as having a long side(s) and a short side(s), it is to be understood that the lengths of the sides of the element are described relative to one another.

Figure 2:
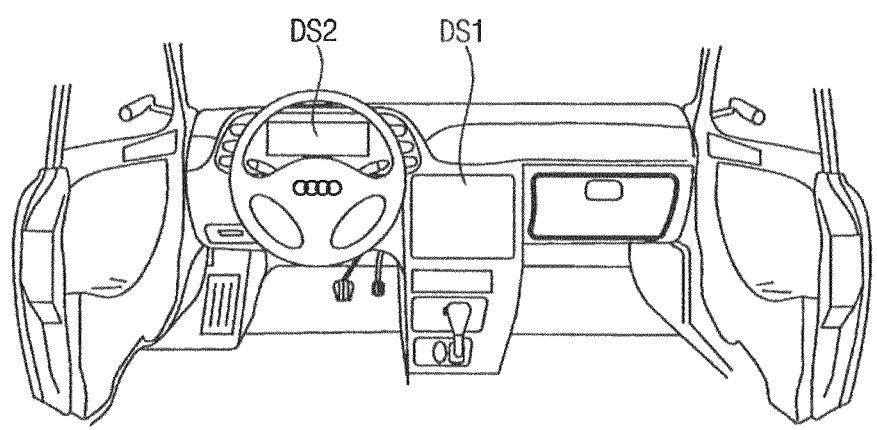
FIG. 2 is a diagram illustrating a first display apparatus and a second display apparatus of the display apparatus of FIG. 1.
Figure 2:
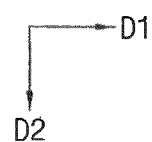

FIG. 1 is a view for explaining a reflection of external light when a display apparatus according to an exemplary embodiment of the inventive concept is used in a vehicle. FIG. 2 is a diagram illustrating a first display apparatus DS1 and a second display apparatus DS2 of the display apparatus of FIG. 1.

Referring to FIGS. 1 and 2, in an exemplary embodiment, a display apparatus may be disposed inside a vehicle, and may display various vehicle information or contents related to driving of the vehicle to a passenger inside the vehicle.

For example, the display apparatus may include a first display apparatus DS1 and a second display apparatus DS2. The first display apparatus DS1 may be disposed in a center fascia area and may display, for example, an image received from a rear camera (e.g., an image provided for reverse driving or parking), or a variety of other vehicle related contents. The second display apparatus DS2 may be disposed in a dashboard region and may display various vehicle information related to vehicle driving.

The first and second display apparatus DS1 and DS2 may be disposed in a display area extending along a first direction D1, which is a horizontal direction, and a second direction D2, which is perpendicular to the first direction D1. The first and second display apparatus DS1 and DS2 may include a plurality of sub-pixels, each corresponding to a light emitting area.

Due to the environment in which the display apparatus for the vehicle is used, it is desirable for the display apparatus to have a high luminance characteristic and a high aperture ratio structure. However, a number of causes of external light reflection may cause visibility problems when a passenger is viewing the display apparatus. For example, sunlight SN incident into the vehicle may be reflected by the display apparatus and perceived by a passenger's field of view EYE. In particular, light incident along the horizontal direction through a window of the vehicle may be reflected from the display apparatus and travel to the passenger's field of view EYE, causing visibility problems.

According to an exemplary embodiment, as described below, a display apparatus for a vehicle having a high aperture ratio structure and reducing external light reflection factors can be provided. Although it is described herein that the display apparatus according to exemplary embodiments may be used in a vehicle, it is to be understood that the display apparatus according to exemplary embodiments is not limited to use in a vehicle.

Figure 3:
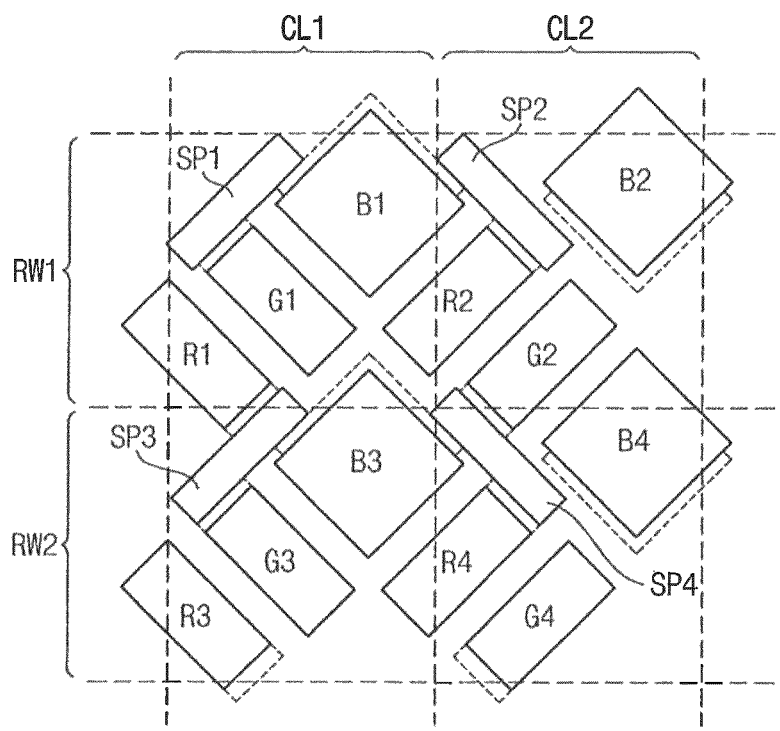
FIG. 3 is a plan view illustrating a sub-pixel arrangement of the display apparatus of FIG. 2 according to an exemplary embodiment of the inventive concept.
Figure 3:
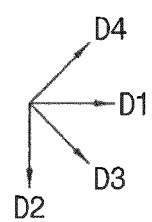
Figure 4:
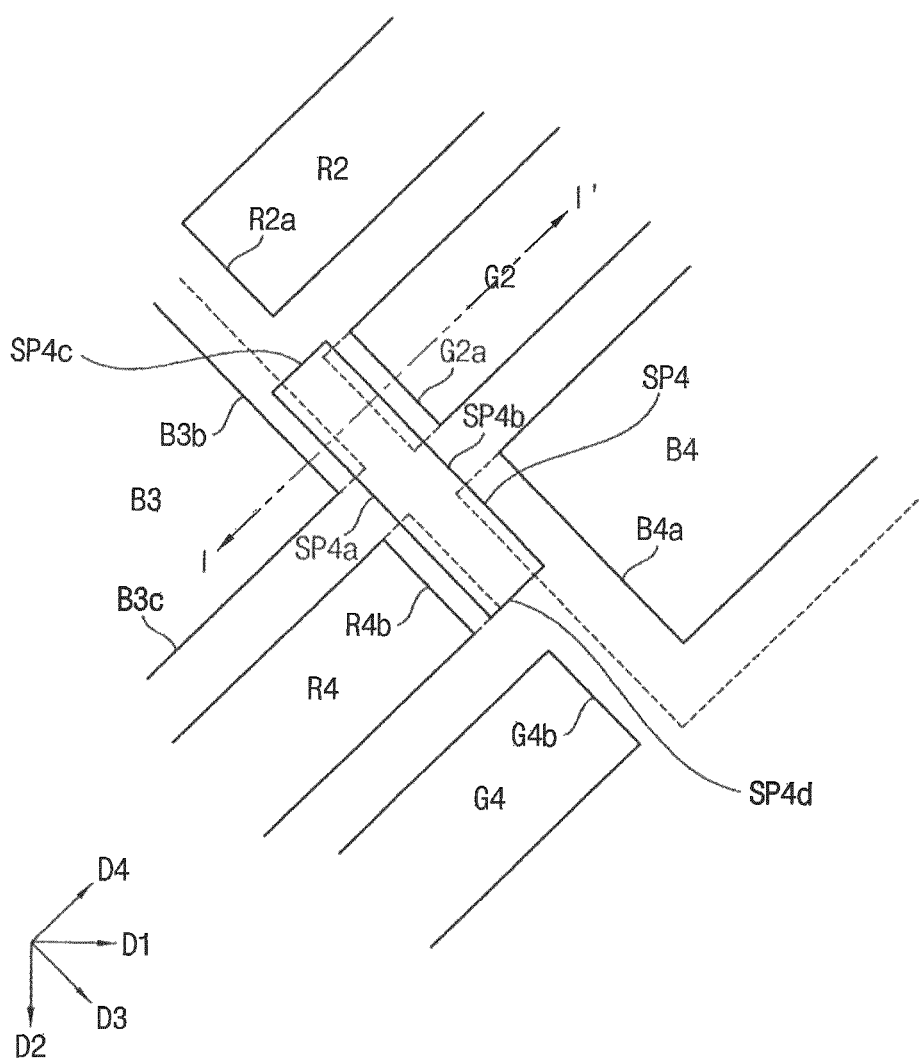
FIG. 4 is a partially enlarged view illustrating a periphery of a fourth spacer of the display apparatus of FIG. 3 in detail according to an exemplary embodiment of the inventive concept.

FIG. 3 is a plan view illustrating a sub-pixel arrangement of the display apparatus of FIG. 2 according to an exemplary embodiment of the inventive concept. FIG. 4 is a partially enlarged view illustrating a periphery of a fourth spacer of the display apparatus of FIG. 3 in detail according to an exemplary embodiment of the inventive concept.

Referring to FIGS. 3 and 4, in an exemplary embodiment, the display apparatus may include a plurality of sub-pixels disposed in a display area extending along a first direction D1, which is a horizontal direction, and a second direction D2, which is perpendicular to the first direction D1. Each of the sub-pixels corresponds to a light emitting area.

The sub-pixels may include a plurality of blue sub-pixels, a plurality of red sub-pixels, and a plurality of green sub-pixels.

For example, a first blue sub-pixel B1, a second blue sub-pixel B2, a third blue sub-pixel B3, and a fourth blue sub-pixel B4 may be arranged in a matrix form along the first direction D1 and the second direction D2. The first blue sub-pixel B1, the second blue sub-pixel B2, the third blue sub-pixel B3, and the fourth blue sub-pixel B4 may emit blue light.

A first red sub-pixel R1, a second red sub-pixel R2, a third red sub-pixel R3, and a fourth red sub-pixel R4 may be arranged in a matrix form along the first direction D1 and the second direction D2. The first red sub-pixel R1, the second red sub-pixel R2, the third red sub-pixel R3, and the fourth red sub-pixel R4 may emit red light.

A first green sub-pixel G1, a second green sub-pixel G2, a third green sub-pixel G3, and a fourth green sub-pixel G4 may be arranged in a matrix form along the first direction D1 and the second direction D2. The first green sub-pixel G1, the second green sub-pixel G2, the third green sub-pixel G3, and the fourth green sub-pixel G4 may emit green light.

A first spacer SP1, a second spacer SP2, a third spacer SP3, and a fourth spacer SP4 may be arranged in a matrix form along the first direction D1 and the second direction D2. The first spacer SP1, the second spacer SP2, the third spacer SP3, and the fourth spacer SP4 may be a structure for maintaining a cell gap between a thin film transistor substrate (see 100 in FIG. 5) and a sealing substrate (see 200 in FIG. 5).

The first blue sub-pixel B1, the first red sub-pixel R1, and the first green sub-pixel G1 may form a first unit pixel. The second blue sub-pixel B2, the second red sub-pixel R2, and the second green sub-pixel G2 may form a second unit pixel. The third blue sub-pixel B3, the third red sub-pixel R3, and the third green sub-pixel G3 may form a third unit pixel. The fourth blue sub-pixel B4, the fourth red sub-pixel R4, and the fourth green sub-pixel G4 may form a fourth unit pixel.

Thus, each of the unit pixels may include a red sub-pixel, a green sub-pixel, and a blue sub-pixel. As shown in FIG. 3, the first unit pixel is arranged in a first row RW1 and a first column CL1. The second unit pixel is arranged in the first row RW1 and a second column CL2. The third unit pixel is disposed in a second row RW2 and the first column CL1. The fourth unit pixel is disposed in the second row RW2 and the second column CL2. Accordingly, the first to fourth unit pixels may be arranged in a matrix form along the first direction D1 and the second direction D2.

For example, one red sub-pixel, one green sub-pixel, one blue sub-pixel, and one spacer may be disposed in one row and one column divided by each unit pixel.

The third blue sub-pixel B3 may include a first side extending along a third direction D3 inclined at a predetermined angle with respect to the first direction D1, a second side B3b facing the first side, a third side extending along a fourth direction D4 perpendicular to the third direction D3, and a fourth side B3c facing the third side. Thus, the second side B3b may extend along the third direction D3 similar to the first side, and the fourth side B3c may extend along the fourth direction D4 similar to the third side. The third blue sub-pixel B3 may have a rhombus shape.

The second green sub-pixel G2 may be disposed adjacent to the second side B3b of the third blue sub-pixel B3 in the fourth direction D4. The second green sub-pixel G2 may have a quadrangular shape having sides extending along the third direction D3 and the fourth direction D4.

The fourth red sub-pixel R4 may be disposed adjacent to the fourth side B3c of the third blue sub-pixel B3 in the third direction D3. The fourth red sub-pixel R4 may have a quadrangular shape having sides extending along the third direction D3 and the fourth direction D4.

The fourth blue sub pixel B4 may be disposed adjacent to the second green sub-pixel G2 in the third direction D3, and adjacent to the fourth red sub-pixel R4 in the fourth direction D4.

The fourth spacer SP4 may be disposed between the third blue sub-pixel B3 and the second green sub-pixel G2, and between the fourth red sub-pixel R4 and the fourth blue sub-pixel B4, and may extend along the third direction D3. The fourth spacer SP4 may include two short sides SP4c and SP4d which oppose each other, and two long sides SP4a and SP4b which oppose each other. A first long side SP4a of the fourth spacer SP4 may be directly adjacent to the second side B3b of the third blue sub-pixel B3 and directly adjacent to a short side R4b of the fourth red sub-pixel R4. A second long side SP4b of the fourth spacer SP4, which opposes the first long side SP4a, may be directly adjacent to a short side G2a of the second green sub-pixel G2 and directly adjacent to a side B4a of the fourth blue sub-pixel B4. The side B4a of the fourth blue sub-pixel B4 may oppose the short side R4b of the fourth red sub-pixel R4 and a short side G4b of the fourth green sub-pixel G4 in the fourth direction D4.

Here, the first direction D1 and the third direction D3 may form an angle of about 45 degrees. Each of the first to fourth blue sub-pixels B1, B2, B3, and B4 may have a rhombus shape.

The first red sub-pixel R1 and the first green sub-pixel G1 may each have an inclined rectangular shape including long sides extending along the third direction D3 and short sides extending along the fourth direction D4.

The second red sub-pixel R2, the second green sub-pixel G2, the fourth red sub-pixel R4, and the fourth green sub-pixel G4 may each have an inclined rectangular shape including short sides extending along the third direction D3 and long sides extending along the fourth direction D4.

Here, the first red sub-pixel R1, the first green sub-pixel G1, and the first blue sub-pixel B1 of the first unit pixel may be diagonally arranged along the fourth direction D4. For example, the first red sub-pixel R1, the first green sub-pixel G1, and the first blue sub-pixel B1 of the first unit pixel may be adjacent to each other along the fourth direction D4. The third red sub-pixel R3, the third green sub-pixel G3, and the third blue sub-pixel B3 of the third unit pixel may be arranged diagonally along the fourth direction D4. For example, the third red sub-pixel R3, the third green sub-pixel G3, and the third blue sub-pixel B3 of the third unit pixel may be adjacent to each other along the fourth direction D4. The second red sub-pixel R2 and the second green sub-pixel G2 of the second unit pixel may be arranged along the third direction D3. For example, the second red sub-pixel R2 and the second green sub-pixel G2 of the second unit pixel may be adjacent to each other along the third direction D3. The second blue sub-pixel B2 may be arranged along the fourth direction D4 with the second red and green sub-pixels R2 and G2. For example, the second blue sub-pixel B2 may be adjacent to the second red and green sub-pixels R2 and G2 in the fourth direction D4. The fourth red sub-pixel R4 and the fourth green sub-pixel G4 of the fourth unit pixel may be arranged along the third direction D3. For example, the fourth red sub-pixel R4 and the fourth green sub-pixel G4 of the fourth unit pixel may be adjacent to each other along the third direction D3. The fourth blue sub-pixel B4 may be arranged along the fourth direction D4 with the fourth red and green sub-pixels R4 and G4. For example, the fourth blue sub-pixel B4 may be adjacent to the fourth red and green sub-pixels R4 and G4 in the fourth direction D4.

In an exemplary embodiment, the size of each of the first to fourth blue sub-pixels B1, B2, B3, and B4 may be larger than the size of each of the first to fourth red sub-pixels R1, R2, R3, and R4, and may be larger than the size of each of the first to fourth green sub-pixels G1, G2, G3, and G4. In an exemplary embodiment, the size of each of the first to fourth red sub-pixels R1, R2, R3, and R4 may be substantially the same as the size of each of the first to fourth green sub-pixels G1, G2, G3, and G4. In an exemplary embodiment, the size of each of the first to fourth blue sub-pixels B1, B2, B3, and B4 may be about twice as large as the size of each of the first to fourth red sub-pixels R1, R2, R3, and R4, and about twice as large as the size of each of the first to fourth green sub-pixels G1, G2, G3, and G4.

A long side of the green or red sub-pixel is adjacent to the first side of the third blue sub-pixel B3. A short side of a green sub-pixel (e.g., the second green sub-pixel G2) and a short side of a red sub-pixel (e.g., the second red sub-pixel R2) are adjacent to the second side B3b of the third blue sub-pixel B3. For example, as shown in FIG. 4, the short side G2a of the second green sub-pixel G2 and a short side R2a of the second red sub-pixel R2 are adjacent to the second side B3b of the third blue sub-pixel B3. For example, the short side G2a of the second green sub-pixel G2 and the short side R2a of the second red sub-pixel R2 may oppose the second side B3b of the third blue sub-pixel B3 in the fourth direction D4. For example, the short side G2a of the second green sub-pixel G2 and the short side R2a of the second red sub-pixel R2 may be parallel to the second side B3b of the third blue sub-pixel B3 in the third direction D3.

In this case, a separation distance between the third blue sub-pixel B3 and the second green sub-pixel G2 may be larger than a separation distance between the third blue sub-pixel B3 and a closest neighboring sub-pixel (e.g., the third green sub-pixel G3) adjacent to the first side of the third blue sub-pixel B3. Here, "closest neighboring" means the sub-pixel from among all of the sub-pixels most adjacent (or closest) to the first side of the third blue sub-pixel B3 in the fourth direction D4. In addition, a separation distance between the third blue sub-pixel B3 and the second green sub-pixel G2 may be greater than a separation distance between the third blue sub-pixel B3 and the second red sub-pixel R2.

According to exemplary embodiments, this configuration results in the securing of sufficient space for the disposition of the fourth spacer SP4 between the third blue sub-pixel B3 and the second green sub-pixel G2 and between the fourth red sub-pixel R4 and the fourth blue sub-pixel B4, and allows for the size of each sub-pixel to be increased/maximized to ensure a sufficient aperture ratio.

In addition, the first red sub-pixel R1 and the first green sub-pixel G1 are shifted to a left upper side with respect to the fourth direction D4. In the second red sub-pixel R2 and the second green sub-pixel G2, the second red sub-pixel R2 is shifted to a left lower side with respect to the third direction D3. Accordingly, misalignment between the first red sub-pixel R1 and the second red sub-pixel R2 in the second direction D2 may be reduced/minimized, thereby improving a cognitive characteristic of the display apparatus when viewed by the user.

Figure 5:
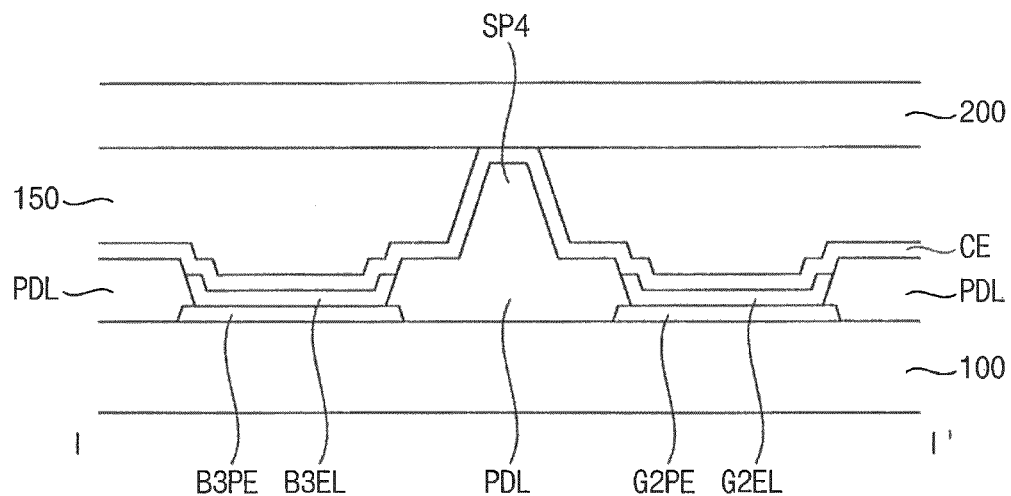
FIG. 5 is a cross-sectional view taken along line I-I' of FIG. 4 according to an exemplary embodiment of the inventive concept.

FIG. 5 is a cross-sectional view taken along line I-I' of FIG. 4 according to an exemplary embodiment of the inventive concept.

Referring to FIG. 5, the display apparatus may include a thin film transistor substrate 100, a plurality of pixel electrodes B3PE and G2PE, a pixel defining layer PDL, a light emitting layer B3EL and G2EL, an opposite electrode CE, a sealing member 150, and a sealing substrate 200. Referring to FIGS. 3, 4 and 5, the thin film transistor substrate 100 may extend in the first direction D1 and the second direction D2.

The thin film transistor substrate 100 may include a plurality of thin film transistors.

The pixel electrodes B3PE, G2PE may be disposed on the thin film transistor substrate 100.

The pixel defining layer PDL may be disposed on the thin film transistor substrate 100 on which the pixel electrodes B3PE, G2PE are disposed. An opening exposing the pixel electrodes B3PE, G2PE may be formed in the pixel defining layer PDL. The pixel defining layer PDL may cover a portion of an edge of the pixel electrode B3PE, G2PE. For example, the pixel defining layer PDL may cover side surfaces (or end surfaces) of the pixel electrode B3PE, G2PE, and may cover a portion of the upper surface of the pixel electrode B3PE, G2PE.

The light emitting layer B3EL, G2EL may be disposed on the pixel electrode B3PE, G2PE in the opening of the pixel defining layer PDL.

The opposite electrode CE may be disposed on the light emitting layer B3EL, G2EL and the pixel defining layer PDL.

The sealing substrate 200 may face the thin film transistor substrate 100. The sealing substrate 200 may seal a light emitting structure formed by the pixel electrode B3PE, G2PE, the light emitting layer B3EL, G2EL, and the opposite electrode CE together with the sealing member 150.

Here, a portion of the pixel defining layer PDL may protrude to form the spacer SP4. The spacer SP4 may maintain a cell gap between the sealing substrate 200 and the thin film transistor substrate 100.

In an exemplary embodiment, the sealing member 150 and the sealing substrate 200 may be replaced with a thin film encapsulation layer. The thin film encapsulation layer may prevent penetration of moisture and oxygen from the outside. The thin film encapsulation layer may include, for example, at least one organic layer and at least one inorganic layer. The at least one organic layer and the at least one inorganic layer may be alternately stacked with each other. For example, the thin film encapsulation layer may include a first inorganic layer, a second inorganic layer, and an organic layer disposed between the first inorganic layer and the second inorganic layer. However, the thin film encapsulation layer of embodiments is not limited thereto.

Figure 6:
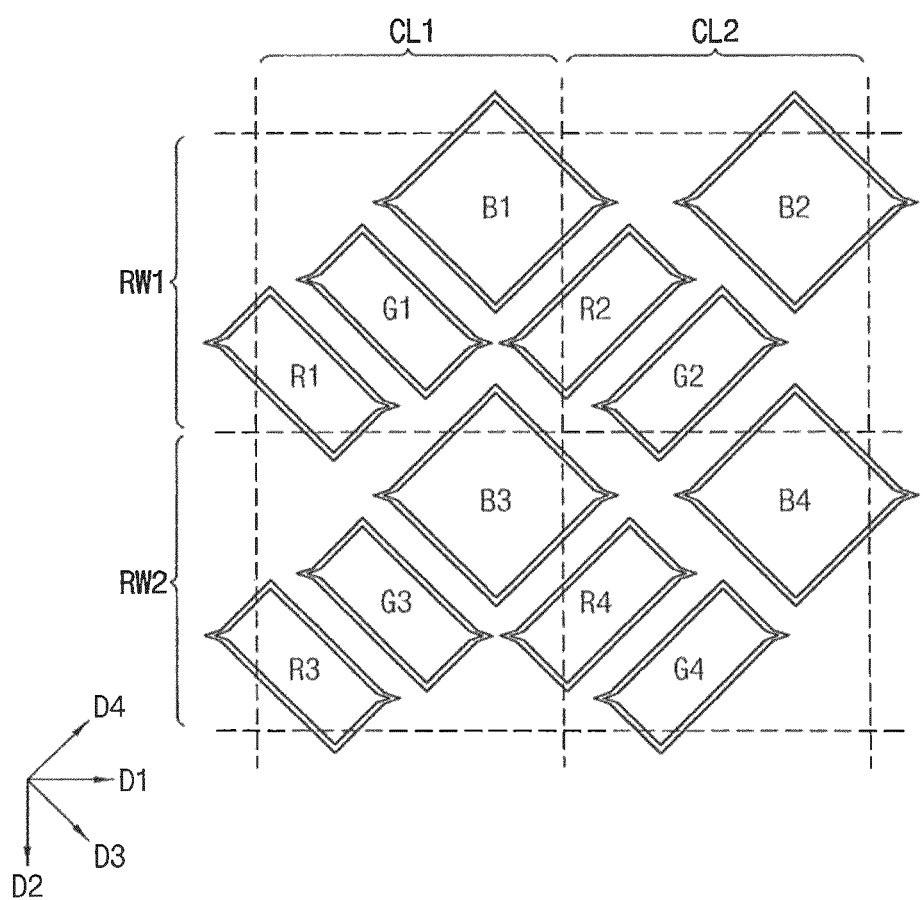
FIG. 6 is a plan view illustrating a sub-pixel arrangement of a display apparatus according to an exemplary embodiment of the inventive concept.
Figure 7:
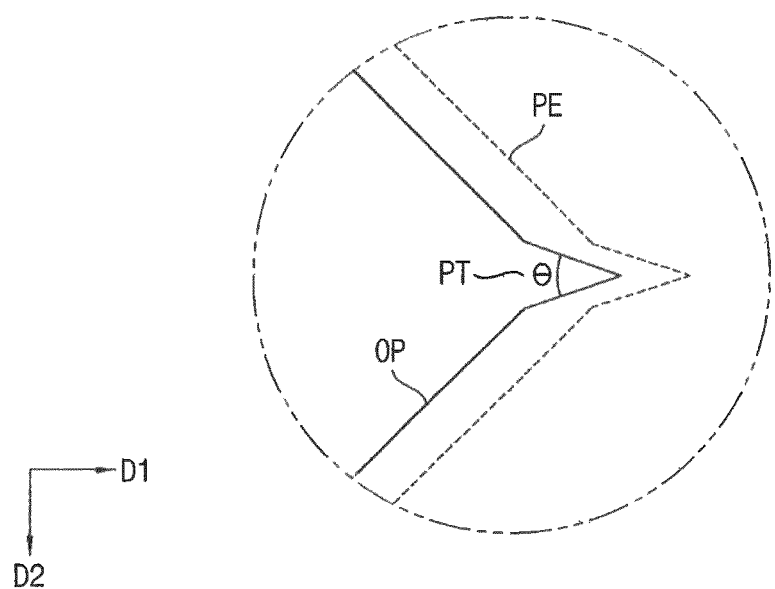
FIG. 7 is a partially enlarged view illustrating one corner of one sub-pixel of the display apparatus of FIG. 6 in detail according to an exemplary embodiment of the inventive concept.

FIG. 6 is a plan view illustrating a sub-pixel arrangement of a display apparatus according to an exemplary embodiment of the inventive concept. FIG. 7 is a partially enlarged view illustrating one corner of one sub-pixel of the display apparatus of FIG. 6 in detail according to an exemplary embodiment of the inventive concept.

Referring to FIG. 6, the display apparatus may include a first blue sub-pixel B1, a second blue sub-pixel B2, a third blue sub pixel B3, and a fourth blue sub pixel B4 arranged in a matrix form in a first direction D1 and a second direction D2.

The display apparatus may further include a first red sub-pixel R1, a second red sub-pixel R2, a third red sub-pixel R3, and a fourth red sub-pixel R4 arranged in a matrix form in the first direction D1 and the second direction D2.

The display apparatus may further include a first green sub pixel G1, a second green sub pixel G2, a third green sub-pixel G3, and a fourth green sub-pixel G4 arranged in a matrix form in the first direction D1 and the second direction D2.

The arrangement of the first to fourth blue sub-pixels B1, B2, B3, and B4, the first to fourth red sub-pixels R1, R2, R3, and R4, and the first to fourth green sub-pixels G1, G2, G3, and G4 are substantially the same as the arrangement of the sub-pixels of the display apparatus of FIG. 3. Therefore, for convenience of explanation, a further detailed description of elements and aspects previously described may be omitted.

Referring to FIG. 7, in an exemplary embodiment, protrusions PT may be formed at corners of each of the sub-pixels defined by an opening OP of a pixel defining layer PDL in a first direction D1. In an exemplary embodiment, protrusions PT may be formed at two corners of each of the sub-pixels. However, exemplary embodiments are not limited thereto. In an exemplary embodiment, the opening OP of the pixel defining layer PDL may have a rhombus shape or an inclined rectangular shape (e.g., with respect to the first and second directions D1 and D2, as shown in FIG. 6).

For example, the opening OP of the pixel defining layer PDL may have sides extending along a third direction D3 inclined at a predetermined angle with the first direction D1, and sides extending along a fourth direction D4 perpendicular to the third direction D3. A protruding opening PT may be formed in an outward direction of the opening OP at a corner of the opening OP of the pixel defining layer PDL in the first direction D1.

A protrusion may be formed at a corner of the pixel electrode PE in the first direction D1 in a location corresponding to the protruding opening PT of the opening OP of the pixel defining layer PDL. The pixel electrode PE may have a rectangular shape or a square shape.

A vertex of the protruding opening PT of the opening OP of the pixel defining layer PDL may form an acute angle having an angle θ of less than about 90 degrees. For example, the acute angle may be about 45 degrees.

Figure 8:
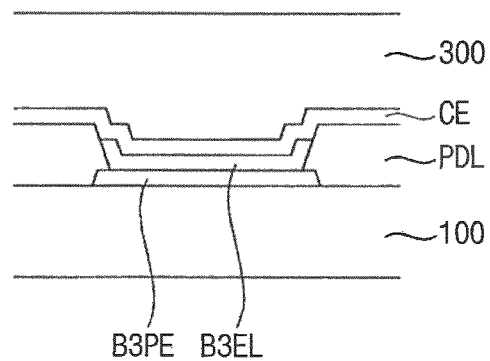
FIG. 8 is a cross-sectional view illustrating a portion corresponding to a third blue sub-pixel of the display apparatus of FIG. 6 according to an exemplary embodiment of the inventive concept.

FIG. 8 is a cross-sectional view illustrating a portion corresponding to a third blue sub-pixel B3 of the display apparatus of FIG. 6 according to an exemplary embodiment of the inventive concept.

The display apparatus may include a thin film transistor substrate 100, a pixel electrode B3PE, a pixel defining layer PDL, a light emitting layer B3EL, an opposite electrode CE, and a sealing part 300.

The thin film transistor substrate 100 may include a plurality of thin film transistors.

The pixel electrode B3PE may be disposed on the thin film transistor substrate 100.

The pixel defining layer PDL may be disposed on the thin film transistor substrate 100 on which the pixel electrode B3PE is disposed. An opening exposing the pixel electrode B3PE may be formed in the pixel defining layer PDL. The pixel defining layer PDL may cover a portion of an edge of the pixel electrode B3PE.

The light emitting layer B3EL may be disposed on the pixel electrode B3PE in the opening of the pixel defining layer PDL.

The opposite electrode CE may be disposed on the emitting layer B3EL and the pixel defining layer PDL.

In an exemplary embodiment, the sealing part 300 may be a sealing member and a sealing substrate. In an exemplary embodiment, the sealing part 300 may be a thin film encapsulation layer. The thin film encapsulation layer may prevent penetration of moisture and oxygen from the outside. The thin film encapsulation layer may include, for example, at least one organic layer and at least one inorganic layer. The at least one organic layer and the at least one inorganic layer may be alternately stacked with each other. For example, the thin film encapsulation layer may include a first inorganic layer, a second inorganic layer, and an organic layer disposed between the first inorganic layer and the second inorganic layer. However, exemplary embodiments are not limited thereto.

Figure 9A:
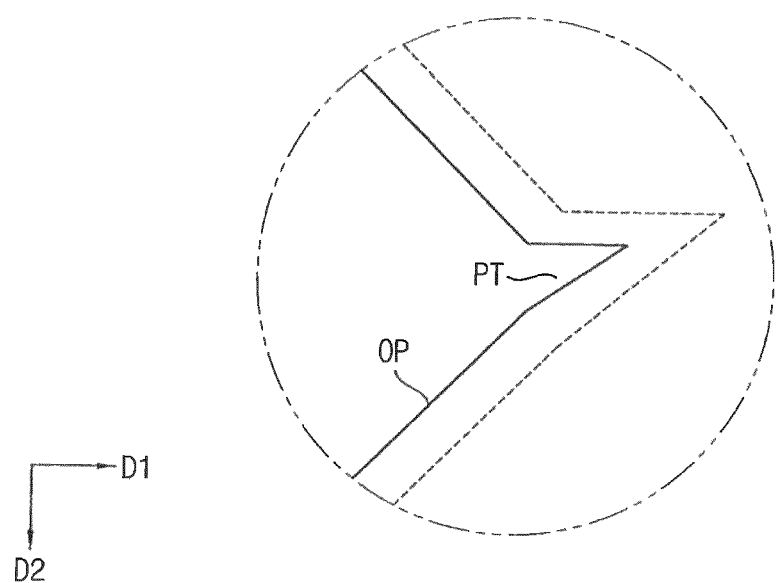
FIGS. 9A, 9B, and 9C are partially enlarged views illustrating one corner of one sub-pixel of a display apparatus in detail according to exemplary embodiments of the inventive concept.
Figure 9B:
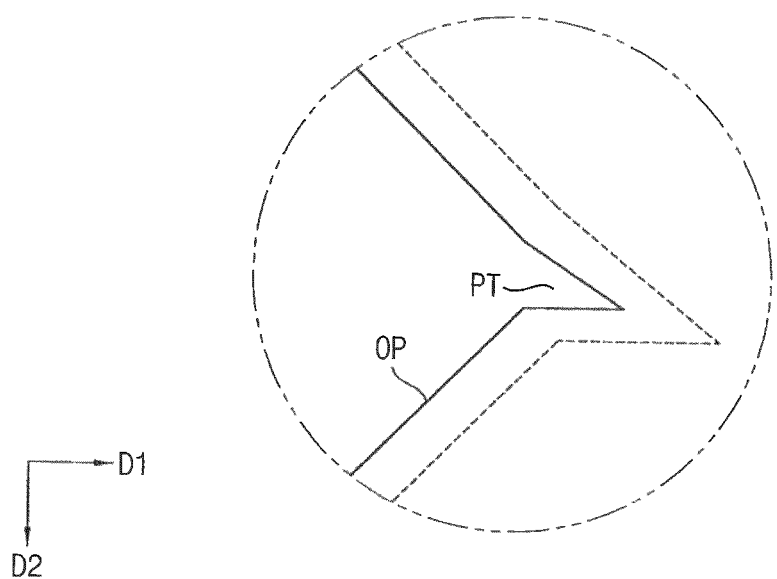
Figure 9C:
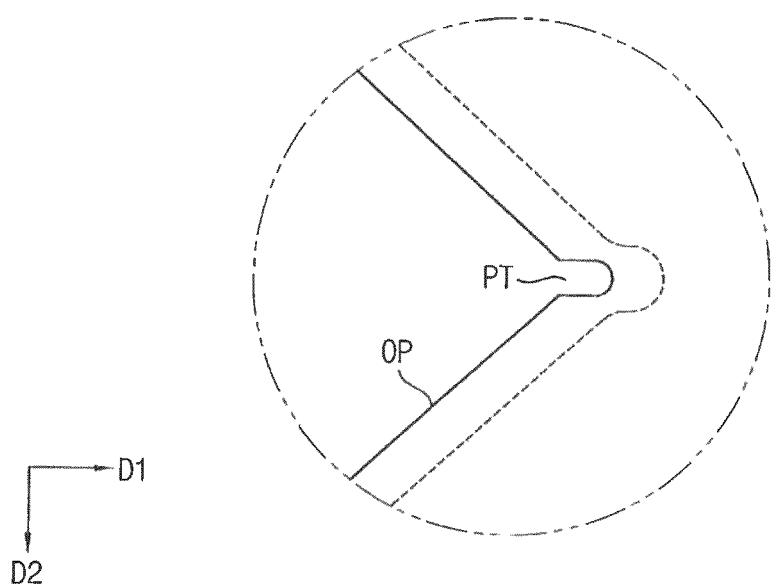

FIGS. 9A, 9B, and 9C are partially enlarged views illustrating one corner of one sub-pixel of a display apparatus in detail according to exemplary embodiments of the inventive concept.

Referring to FIGS. 9A, 9B, and 9C, the protruding openings PT of the openings OP of the pixel defining layer PDL may have various shapes. The protruding opening PT may protrude in a direction inclined by a predetermined angle with respect to the first direction D1 or may have a curved shape. However, exemplary embodiments are not limited thereto. For example, the protruding opening PT of the opening OP of the pixel defining layer PDL may have various shapes in which the side formed along the second direction D2 is reduced/minimized.

Figure 10A:
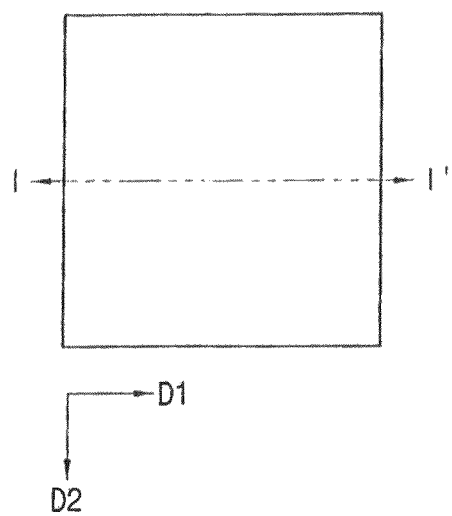
FIGS. 10A and 10B are plan and cross-sectional views illustrating external light reflection of one sub-pixel of a display apparatus according to a comparative example.
Figure 10B:
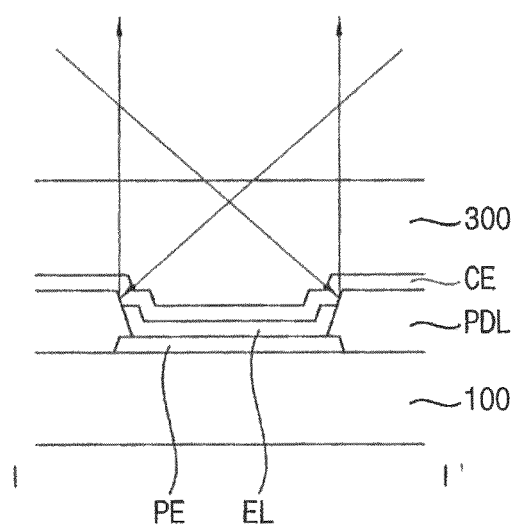
Figure 11A:
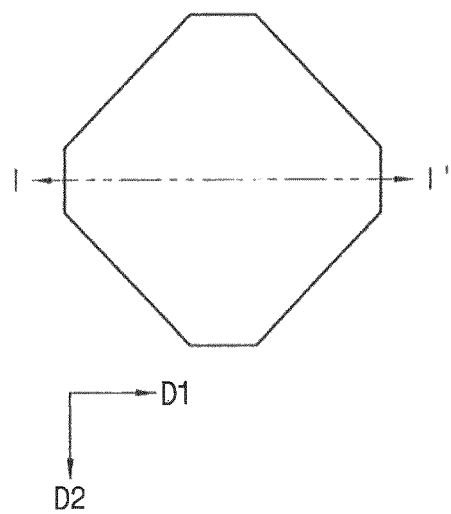
FIGS. 11A and 11B are plan and cross-sectional views illustrating reflection of external light of one sub-pixel of a display apparatus according to another comparative example.
Figure 11B:
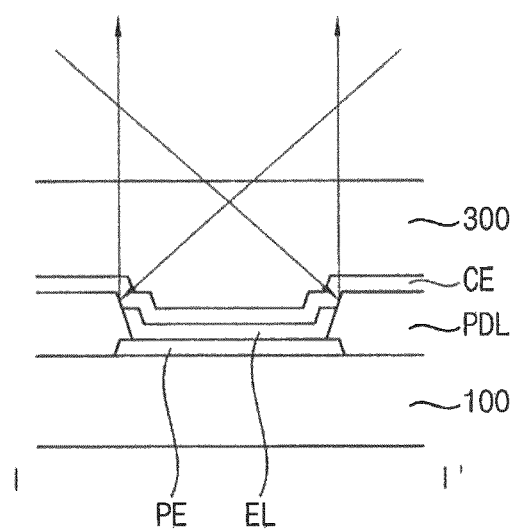

FIGS. 10A and 10B are plan and cross-sectional views illustrating external light reflection of one sub-pixel of a display apparatus according to a comparative example. FIG. 10B is a cross-sectional view taken along line I-I' of FIG. 10A. FIGS. 11A and 11B are plan and cross-sectional views illustrating reflection of external light of one sub-pixel of a display apparatus according to another comparative example. FIG. 11B is a cross-sectional view taken along line I-I' of FIG. 11A.

Referring to FIGS. 10A and 10B, a display apparatus may include a thin film transistor substrate 100, a pixel electrode PE, a pixel defining layer PDL, a light emitting layer EL, an opposite electrode CE, and a sealing part 300. For convenience of explanation, a further description of elements and technical aspects is omitted herein.

Still referring to FIGS. 10A and 10B, it can be seen that external light reflection mainly occurs on an inclined surface of the pixel defining layer PDL having an opening. For example, reflection may occur at a side extending in a second direction D2 of the opening of the pixel defining layer PDL, and such reflection may be recognized by the user (see FIG. 1).

Referring to FIGS. 11A and 11B, a display apparatus may include a thin film transistor substrate 100, a pixel electrode PE, a pixel defining layer PDL, a light emitting layer EL, an opposite electrode CE, and a sealing part 300. For convenience of explanation, a further description of elements and technical aspects is omitted herein.

Still referring to FIGS. 11A and 11B, a shape of the opening of the pixel defining layer PDL may be a rhombus shape, which may reduce a length of the side extending along the second direction D2 of the opening, thereby reducing external light reflection. However, a portion extending along the second direction D2 may be formed at a corner of the opening in the first direction D1, and the reflection of external light in the portion may be visually recognized by the user.

In contrast to the comparative examples described above, in exemplary embodiments, according to the structure of the display apparatus illustrated in FIGS. 6 to 9C, a protruding opening PT in an outward direction of the opening OP is formed at the corner of the opening OP in the first direction D1, thereby reducing/minimizing reflection of external light at the corner.

Figure 12:
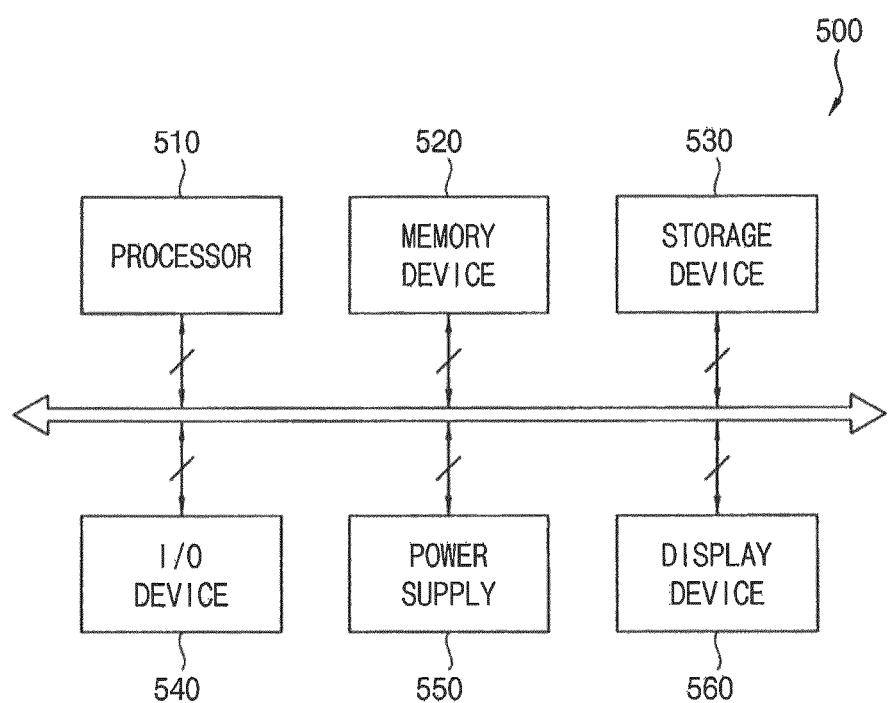
FIG. 12 is a block diagram illustrating an electronic device according to exemplary embodiments of the inventive concept.

FIG. 12 is a block diagram illustrating an electronic device according to exemplary embodiments.

Referring to FIG. 12, an electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with, for example, a video card, a sound card, a memory card, a universal serial bus (USB) device, or other electronic devices. According to exemplary embodiments, the electronic device 500 may be, for example, a television, a cellular phone such as a smartphone, a smartwatch, a tablet PC, a car navigation system, a computer monitor, a laptop, a head mounted display (HMD), etc. However, the electronic device 500 of embodiments is not limited thereto.

The processor 510 may perform various computing functions. The processor 510 may be, for example, a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include, for example, a solid state drive (SSD) device, a hard disk drive (HDD) device, a CD-ROM device, etc. The I/O device 540 may include, for example, an input device such as a keyboard, a keypad, a mouse device, a touchpad, a touchscreen, etc., and an output device such as a printer, a speaker, etc. The power supply 550 may provide power for operations of the electronic device 500.

The display device 560 may be coupled to other components via the buses or other communication links. In exemplary embodiments, the display device 560 may be included in the I/O device 540. As described above, the display device 560 includes sub-pixels and spacers that are appropriately arranged, thereby implementing a high aperture ratio structure. Since protrusions are formed at corners of the sub-pixels to reduce reflection of external light in some exemplary embodiments, a display apparatus suitable for a vehicle display device can be provided.

As discussed, embodiments may provide a display apparatus, comprising: a display area extending in a first direction and a second direction, wherein the first direction is a horizontal direction, and the second direction is perpendicular to the first direction; a first sub-pixel, arranged to emit a first color light, comprising first and second sides extending in a third direction which is inclined at a predetermined angle with the first direction, and third and fourth sides extending in a fourth direction perpendicular to the third direction; a second sub-pixel, arranged to emit a second color light, disposed adjacent to the second side of the first sub-pixel in the fourth direction; a third sub-pixel, arranged to emit a third color light, disposed adjacent to the fourth side of the first sub-pixel in the third direction; a fourth sub-pixel, which emits the first color light, disposed adjacent to the second and third sub-pixels; and a spacer, which maintains a cell gap, disposed between the first sub-pixel and the second sub-pixel and between the third sub-pixel and the fourth sub-pixel, and extending in the third direction, wherein the first to fourth sub-pixels are disposed in the display area, and each of the first to fourth sub-pixels corresponds to a light emitting area.

The fourth sub-pixel may be disposed adjacent to the second sub-pixel in the third direction, and may be adjacent to the third sub-pixel in the fourth direction.

The spacer may be arranged to extend in the third direction so that it is between the first sub-pixel and the second sub-pixel when considered in the fourth direction and between the third sub-pixel and the fourth sub-pixel when considered in the fourth direction.

A fifth sub-pixel, arranged to emit the third color light, may be disposed adjacent to the second side of the first sub-pixel in the fourth direction wherein the fifth sub-pixel is adjacent the second sub-pixel in the third direction. Hence, the second and fifth sub-pixels may both be adjacent the second side of the first sub-pixel in the fourth direction. The spacer may be adjacent the second sub-pixel, but not the fifth sub-pixel.

A sixth sub-pixel, arranged to emit the second color light, may be disposed adjacent to the third sub-pixel in the third direction. The sixth sub-pixel and the third sub-pixel may both be adjacent the fourth sub-pixel in the fourth direction. The spacer may be adjacent the third sub-pixel, but not the sixth sub-pixel.

A seventh sub-pixel, arranged to emit the second color light, may be disposed adjacent to the first side of the first sub-pixel in the fourth direction.

An eighth sub-pixel, arranged to emit the third color light, may be disposed adjacent to the third side of the first sub-pixel in the third direction.

A second spacer, which maintains a cell gap, may be disposed between the first sub-pixel and the seventh sub-pixel in the fourth direction and between the first sub-pixel and the eighth sub-pixel in the third direction.

Protrusions may be formed at corners of the sub-pixels in the first direction.

The display apparatus may comprise a thin film transistor substrate extending in the first direction; a pixel electrode disposed on the thin film transistor substrate; and a pixel defining layer disposed on the thin film transistor substrate and having an opening exposing a portion of the pixel electrode, wherein the opening of the pixel defining layer comprises sides extending along the third direction, and sides extending along the fourth direction, and a protruding opening is formed in an outward direction of the opening at a corner of the opening of the pixel defining layer in the first direction.

Exemplary embodiments of the present inventive concept can be applied to organic light emitting display devices and various electronic devices including the same. For example, exemplary embodiments can be applied to a mobile phone, a smartphone, a smartwatch, a tablet PC, a car navigation system, a television, a computer monitor, a notebook, etc.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display apparatus, comprising:
   a display area extending in a first direction and a second direction,
   wherein the first direction is a horizontal direction, and the second direction is perpendicular to the first direction;
   a first sub-pixel, which emits a first color light, comprising first and second sides extending in a third direction which is inclined at a predetermined angle with the first direction, and third and fourth sides extending in a fourth direction perpendicular to the third direction;
   a second sub-pixel, which emits a second color light, disposed adjacent to the second side of the first sub-pixel in the fourth direction;
   a third sub-pixel, which emits a third color light, disposed adjacent to the fourth side of the first sub-pixel in the third direction;
   a fourth sub-pixel, which emits the first color light, disposed adjacent to the second and third sub-pixels; and
   a spacer, which maintains a cell gap, disposed between the first sub-pixel and the second sub-pixel and between the third sub-pixel and the fourth sub-pixel, and extending in the third direction,
   wherein the first to fourth sub-pixels are disposed in the display area, and each of the first to fourth sub-pixels corresponds to a light emitting area.

2. The display apparatus of claim 1, wherein the first direction and the third direction form an angle of about 45 degrees, and the first sub-pixel has a rhombus shape.

3. The display apparatus of claim 2, wherein the second sub-pixel and the third sub-pixel each have a quadrangular shape having sides extending along the third direction and the fourth direction.

4. The display apparatus of claim 3, wherein a size of the first sub-pixel is larger than a size of at least one of the second sub-pixel or the third sub-pixel.

5. The display apparatus of claim 3, wherein the first color light is blue light, the second color light is green light, and the third color light is red light.

6. The display apparatus of claim 3, wherein a long side of a first green sub-pixel or a first red sub-pixel is adjacent to the first side of the first sub-pixel, and
   a short side of the second sub-pixel, which is a second green sub-pixel and a short side of a second red sub-pixel are adjacent to the second side of the first sub-pixel.

7. The display apparatus of claim 1, wherein a separation distance between the first sub-pixel and the second sub-pixel is greater than a separation distance between the first sub-pixel and a closest neighboring sub-pixel adjacent to the first side of the first sub-pixel.

8. The display apparatus of claim 1, further comprising:
a fifth sub-pixel, which emits the third color light, disposed adjacent to the second side of the first sub-pixel in the fourth direction,
wherein the fifth sub-pixel and the second sub-pixel are spaced apart from each other in the third direction, and
a separation distance between the first sub-pixel and the second sub-pixel is greater than a separation distance between the first sub-pixel and the fifth sub-pixel.

9. The display apparatus of claim 1, further comprising:
a thin film transistor substrate comprising a plurality of thin film transistors;
a plurality of pixel electrodes disposed on the thin film transistor substrate;
a pixel defining layer disposed on the thin film transistor substrate and having an opening exposing the pixel electrodes; and
a sealing substrate facing the thin film transistor substrate,
wherein the spacer is formed by a protruding portion of the pixel defining layer.

10. The display apparatus of claim 9, wherein a protruding opening is formed in an outward direction of the opening at a corner of the opening of the pixel defining layer in the first direction.

11. A display apparatus, comprising:
a thin film transistor substrate extending in a first direction, which is a horizontal direction, and a second direction perpendicular to the first direction;
a pixel electrode disposed on the thin film transistor substrate; and
a pixel defining layer disposed on the thin film transistor substrate and having an opening exposing a portion of the pixel electrode,
wherein the opening of the pixel defining layer comprises sides extending along a third direction inclined at a predetermined angle with the first direction, and sides extending along a fourth direction perpendicular to the third direction, and
a protruding opening is formed in an outward direction of the opening at a corner of the opening of the pixel defining layer in the first direction.

12. The display apparatus of claim 11, wherein a protrusion is formed at a corner of the pixel electrode in the first direction in a location corresponding to the protruding opening of the opening of the pixel defining layer.

13. The display apparatus of claim 11, wherein the protruding opening of the opening of the pixel defining layer has a curved shape.

14. The display apparatus of claim 11, wherein a vertex of the protruding opening of the opening of the pixel defining layer has an angle of less than about 90 degrees.

15. The display apparatus of claim 11, wherein the pixel electrode has a rectangular shape or a square shape.

16. The display apparatus of claim 11, further comprising:
a light emitting layer disposed on the pixel electrode; and
an opposite electrode disposed on the light emitting layer.

17. The display apparatus of claim 11, further comprising:
a plurality of sub-pixels, each of which is a light emitting area,
wherein the plurality of sub-pixels comprises:
a first sub-pixel, which emits a first color light, comprising first and second sides extending in the third direction, and third and fourth sides extending in the fourth direction;
a second sub-pixel, which emits a second color light, disposed adjacent to the second side of the first sub-pixel in the fourth direction;
a third sub-pixel, which emits a third color light, disposed adjacent to the fourth side of the first sub-pixel in the third direction; and
a fourth sub-pixel, which emits the first color light, disposed adjacent to the second and third sub-pixels.

18. The display apparatus of claim 17, further comprising:
a sealing substrate facing the thin film transistor substrate; and
a spacer, which maintains a cell gap, disposed between the thin film transistor substrate and the sealing substrate, between the first sub-pixel and the second sub-pixel, and between the third sub-pixel and the fourth sub-pixel, and extending in the third direction.

19. The display apparatus of claim 17, wherein a size of the first sub-pixel is larger than a size of at least one of the second sub-pixel or the third sub-pixel.

20. The display apparatus of claim 11, wherein the first direction and the third direction form an angle of about 45 degrees, and the opening of the pixel defining layer has a rhombus shape or an inclined rectangular shape with respect to the first direction and the second direction.

* * * * *